United States Patent [19]

Ushifusa et al.

[11] Patent Number: 4,821,142
[45] Date of Patent: Apr. 11, 1989

[54] CERAMIC MULTILAYER CIRCUIT BOARD AND SEMICONDUCTOR MODULE

[75] Inventors: Nobuyuki Ushifusa; Hiroichi Shinohara, both of Hitachi; Kousei Nagayama, Ibaraki; Satoru Ogihara; Tasao Soga, both of Hitachi, all of Japan

[73] Assignee: Hitachi, Ltd., Tokyo, Japan

[21] Appl. No.: 58,255

[22] Filed: Jun. 4, 1987

[30] Foreign Application Priority Data

Jun. 6, 1986 [JP] Japan .................. 61-130136

[51] Int. Cl.4 ............................................. H05K 01/03
[52] U.S. Cl. .................................. 361/395; 174/68.5; 361/414
[58] Field of Search ............... 174/68.5; 361/414, 411, 361/395; 501/55, 80

[56] References Cited

U.S. PATENT DOCUMENTS

| | | | |
|---|---|---|---|
| 3,030,215 | 4/1962 | Veatch et al. ................. | 501/55 X |
| 4,374,391 | 2/1983 | Camliel ........................ | 501/54 X |
| 4,547,625 | 10/1985 | Tosaki et al. ................. | 501/54 X |
| 4,620,264 | 10/1986 | Ushifusa et al. .............. | 174/68.5 X |
| 4,672,152 | 6/1987 | Shinohara et al. ............ | 361/414 X |
| 4,685,033 | 8/1987 | Inoue ........................... | 174/68.5 X |

FOREIGN PATENT DOCUMENTS

| | | | |
|---|---|---|---|
| 61-83674 | 4/1986 | Japan ........................... | 501/80 |
| 2162167 | 1/1986 | United Kingdom .......... | 501/255 |

OTHER PUBLICATIONS

Anderson et al., Low-Dielectric Glass Substrate, IBM Tech. Disc. Bull., vol. #14, #9, Feb. 1972, p. 2581.

*Primary Examiner*—R. R. Kucia
*Attorney, Agent, or Firm*—Antonelli, Terry & Wands

[57] ABSTRACT

A ceramic multilayer circuit board comprising ceramic layers and wiring conductor layers laminated alternately, in which the ceramic layer has a thermal expansion coefficient lower than that of the wiring conductor and not lower than one half of that of the conductor layer and is formed from a glass which softens at a temperature not higher than the melting point of the wiring conductor layer; a semiconductor module having a high reliability in its solder joint part comprising said ceramic multilayer circuit board mounted with a ceramic carrier substrate being mounted with a semiconductor device, said board being able to use a silver or copper conductor having a good electro-conductivity; and an amorphous glass powder for said ceramic multilayer circuit board.

9 Claims, 2 Drawing Sheets

CERAMIC MULTILAYER CIRCUIT BOARD AND SEMICONDUCTOR MODULE

TECHNICAL FIELD

This invention relates to a novel ceramic multilayer circuit substrate, and particularly to a semiconductor module comprising a ceramic multilayer circuit board mounted with a carrier substrate, said substrate being mounted with a semiconductor device. Particularly, it relates to a semiconductor module structure in which a silver or copper conductor having a good electroconductivity can be used in the multilayer circuit board, and further the solder joint part of the semiconductor device has a good reliability.

BACKGROUND ART

To attain a higher operation speed in a large electronic computer, it is necessary to attain a higher signal propagation speed in a semiconductor device itself and in a system in which the device is packaged. In recent years, for semiconductor devices, the development of high-integration technology has resulted in markedly higher speed and higher integration, and the packaging technology has come to affect greatly on increasing the operation speed. As to the packaging technology, ceramic multilayer circuit substrates have come to be used in order to enable a high density packaging of semiconductor devices and to reduce the delay of electric signals. Previously, alumina has been generally used as the insulating material for ceramic multilayer circuit substrates. In recent years, however, to enhance the properties of the substrate further, there have been studied and developed low-temperature sintered substrate materials, such as those described in "multilayer ceramic substrate" [Japanese Patent Application Kokoku (Post-Exam. Publn.) No. 22,399/84], and low-temperature sintered material of low dielectric constant formed by bonding silica with glass, such as those described in "ceramic multilayer wiring circuit board" [Japanese Patent Application Kokai (Laid-open) No. 11,700/84]. In these circuit board materials, which are obtained by sintering the original material densely so as to contain as few pores as possible therein, the specific dielectric constant, which affects greatly on attaining a higher operation speed, is about 4 to 5 at the lowest.

Further, there have been already obtained, for the purpose of heat insulation, weight reduction, or sound insulation, substrates which contain pores within the ceramics, such as those described in "composite ceramic electronic material" [Japanese Patent Application Kokai (Laid-open) No. 89,212/82] and "process for producing foamed ceramic board" [Japanese Patent Application Kokai (Laid-open) No. 83,985/84]. However, no consideration has been given to these substrates for using them as the substrate material for large electronic computers in which a higher signal propagation speed is required.

On the other hand, with the advent of semiconductors of higher speed and higher density, methods have come to be used in which semiconductor devices are directly packaged on a ceramic multilayer circuit substrate in order to facilitate heat radiation and to increase the speed of the device. However, this packaging method has a problem in that as the size of the semiconductor device increases, the stress which develops between the semiconductor device material and the ceramic multilayer wiring circuit substrate material owing to the temperature change during packaging increases. Accordingly, attempts have been made to bring the thermal expansion coefficient of the ceramic multilayer wiring circuit substrate close to that of the semiconductor device. However, to obtain a high density wiring by using gold, copper, silver etc., which have a low electric resistance, as the wiring conductor material, the thermal expansion coefficient of the ceramic insulating material should be brought close to that of these conductor materials. Thus, the thermal expansion coefficient of the ceramic insulating material is required to be close to that of the semiconductor device material and that of the conductor material. However, no due consideration has been given to a packaging technology suitable under these mutually contradictory conditions.

In a ceramic multilayer circuit substrate, the insulating material is required to have as low a dielectric constant as possible to attain a higher signal propagation speed. Further, the conductor material used is required to have a low electric resistance. As described, for example, in "ceramic multilayer wiring circuit board" [Japanese Patent Application Kokai (Laid-open) No. 11,700/84], a substrate material having a specific dielectric constant of 4 to 5 has been obtained which comprises silica, which has a low dielectric constant, bonded with glass. Further, since the material can be fired at a temperature not higher than 1,000° C., conductor materials of low electric resistance, namely gold, copper, silver etc., can be used in combination therewith. Further, the thermal expansion coefficient of the ceramic multilayer circuit board material has been brought as close to that of the semiconductor device as possible, and is much different from that of the conductor material. Thus, no due attention has been paid to attaining a high density wiring of the internal circuit and yet mounting the semiconductor devices in a high density and with good reliability.

The object of this invention is to provide a packaging technology which gives a ceramic multilayer circuit substrate comprising a ceramic insulating material of lower specific dielectric constant and such conductor material of low resistance as gold, copper, or silver wired in a high density thereon and which makes it possible to mount the semiconductor devices in a high density and with good reliability.

DISCLOSURE OF INVENTION

According to this invention, there is provided a ceramic multilayer circuit board comprising ceramic layers and wiring conductor layers laminated alternately, in which the ceramic layer has a thermal expansion coefficient lower than that of the wiring conductor and not lower than one half of that of the conductor layer and is formed from a glass which softens at a temperature not higher than the melting point of the wiring conductor layer.

BEST MODE FOR CARRYING OUT THE INVENTION

Figure 1:
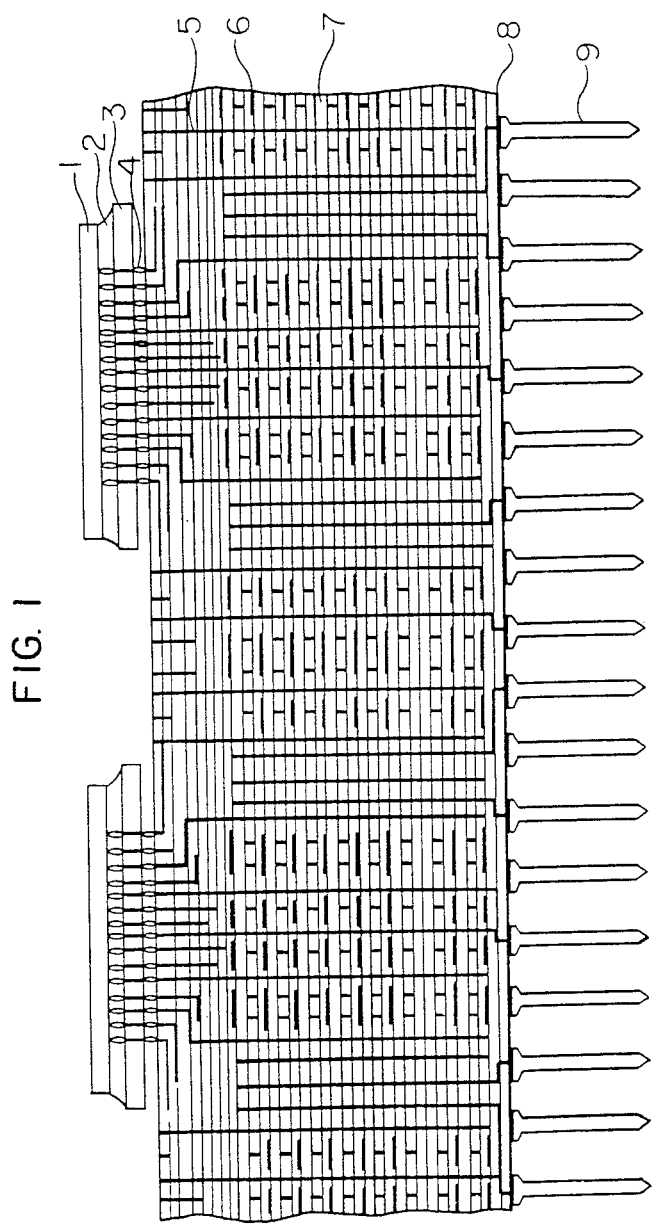
FIGS. 1 and 2 are each a longitudinal sectional view of a semiconductor module showing an embodiment of this invention.
Figure 2:
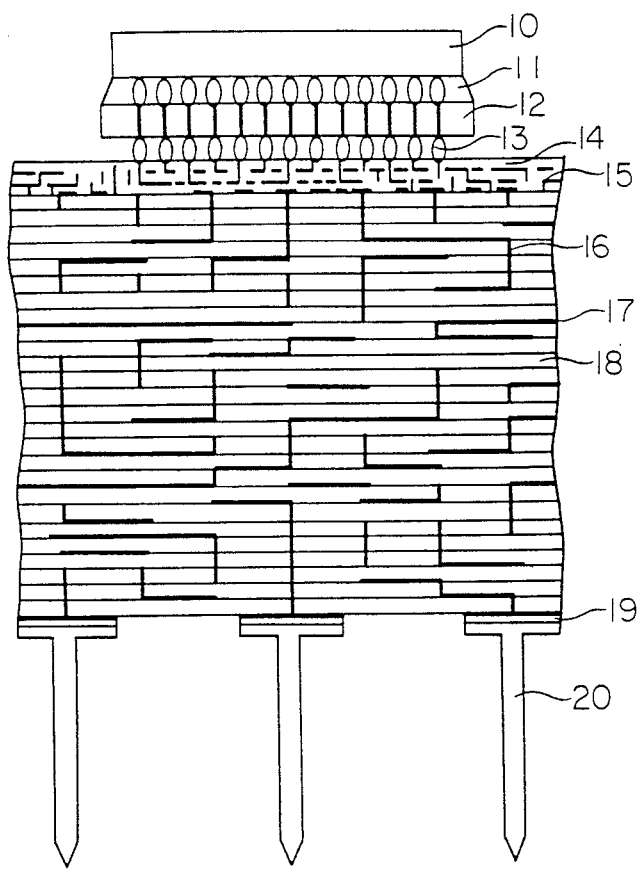

In FIGS. 1 and 2, reference numbers 1 and 10 denote a semiconductor device, reference numbers 2 and 11 denote a material comprising, as the main component, an organic material, reference numbers 3 and 12 denote a carrier substrate, reference numbers 4 and 13 denote a solder, reference numbers 5 and 16 denote a via-hole conductor material, reference numbers 6 and 17 denote a wiring conductor material, reference numbers 7 and 18 denote a ceramic insulating material, reference numbers 8 and 19 denote a gold-germanium solder, reference numbers 9 and 20 denote a kovar pin, reference number 14 denotes a polyamide resin and reference number 15 denotes a copper conductor wiring material.

The ceramic layer has a thermal expansion coefficient of not lower than $7.2 \times 10^{-6}/°C$. and a specific dielectric constant at 1 MHz of not higher than 4.5. The wiring conductor layer is formed from either gold, or silver, or copper.

The ceramic multilayer circuit board according to this invention can have a still lower dielectric constant when it comprises hollow silica having a particle diameter of 100 μm or less dispersed in a ceramic layer. The content of hollow silica is preferably 35 to 60% by volume relative to the ceramic layer.

For the purpose of lowering the specific dielectric constant of the ceramic insulating material, which is one of the objects mentioned above, those materials are conceivable which comprise a filler of a low dielectric constant bonded with glass. As to fillers of a low dielectric constant, silica has the lowest dielectric constant among inorganic materials. However, since the specific dielectric constant of silica is about 4, a ceramic insulating material with a specific dielectric constant of less than 4 can be obtained only with difficulty by the prior method of sintering the ceramic densely. The present inventors have then hit upon the idea that the specific dielectric constant of the ceramic insulating material could be lowered to less than 4 by incorporating pores thereto since the specific dielectric constant of air is about 1. Although there have already been known structural materials which contain a number of pores for the purpose of heat insulation and sound insulation, the pores contained in such materials have generally a large diameter of several millimeters and hence the materials cannot be used for a multilayer circuit board. Accordingly, in order that such materials can be used for a multilayer circuit board, since the internal wiring is highly integrated and susceptible to short circuit and breaking of wire, the pores contained therein should have a minute diameter of not more than 100 μm.

To prepare an insulating material comprising ceramics containing pores therein, there can be conceived, for example, a method which comprises mixing ceramic powders with a blowing agent and firing the mixture with simultaneous foaming to obtain a ceramic containing pores therein, or a method which comprises mixing hollow microspheres with ceramic powders and sintering the mixture. However, since the method of using a blowing agent can only with difficulty give a large number of uniform and minute pores dispersed in ceramics, the method of combining hollow microspheres with ceramics has been adopted. Referring to the hollow microspheres, to obtain as low a specific inductive capacity as possible, hollow silica microspheres comprising, as the principal component, silica, which has the lowest dielectric constant among inorganic materials, have been adopted, those having a particle diameter of not more than 100 μm being selected. The ceramics used for bonding hollow silica microspheres have been selected, since the mixture must be sintered at a temperature not higher than the melting point of such wiring conductor materials as gold, copper, or silver, from glass and crystallized glass which soften at a temperature not higher than the said melting point. The "crystallized glass" is a glass in which a crystalline phase separates out from an amorphous state on heating, and has both of low-temperature sinterability and strength.

The hollow silica microspheres used in this invention, which need to have a minute diameter of not more than about 100 μm, were prepared in the following manner. Thus, Na-containing silica was formed into hollow particles by means of spray dyring, which were then rapidly heated to give hollow microspheres. The microspheres were then cooled and subjected to acid treatment, water washing etc. to reduce their Na content to not more than 2% by weight. When the Na content is not more than 2% by weight, the microspheres show no softening at a temperature not higher than 1000° C. and have thus a sufficiently high heat-resistant temperature.

For the purpose of attaining a high-density wiring of a low resistance conductor material, which is the other object mentioned above, the difference in the thermal expansion coefficient between the ceramic insulating material and the conductor material should be made small. Further, the conductor material is preferably as close to pure metal as possible in order to give as low an electric resistance as possible. Since the thermal expansion coefficient of gold, copper or silver is high, namely $1.44 \times 10^{-5}/°C.$, $1.68 \times 10^{-5}/°C.$ or $1.93 \times 10^{-5}/°C.$ respectively, the result of stress analysis shows that the ceramic insulating material should also have a thermal expansion coefficient of at least half of the above-mentioned coefficients. Resultantly, when gold is used as the conductor material the ceramic insulating material should have a thermal expansion coefficient of not less than $7.2 \times 10^{-6}/°C$. Similarly, when copper is used as the conductor material, the ceramic insulating material should have a thermal expansion coefficient of not less than $8.4 \times 10^{-6}/°C$. Thus, although the previous tendency has been toward bringing the thermal expansion coefficient of the ceramic insulating material close to that of silicon of the semiconductor device, to attain a high-density wiring the thermal expansion coefficient of the ceramics insulating material should be increased on the contrary, so as to become close to that of the conductor material. Accordingly, the resulting multilayer circuit board has a relatively large thermal expansion coefficient and hence is difficult to be directly mounted with silicon, a semiconductor device. Therefore, some new method should be devised to package silicon, a semiconductor device, in a high density. Thus, it has been devised to relax the difference in thermal expansion coefficient between the ceramic multilayer circuit board and the semiconductor device by providing a carrier substrate between the ceramic multilayer circuit substrate and the semiconductor device. First, a semiconductor device is directly mounted on a carrier substrate by means of solder bump. Then, a material comprising as the main component an organic material having substantially the same thermal expansion coefficient as that of the solder is inserted between the semiconductor device and the carrier substrate. Thereafter, the resulting system is joined onto a ceramic multilayer circuit substrate by means of solder bump to obtain a module. In this case, since the carrier substrate and the ceramic multilayer circuit substrate are joined with solder alone, the thermal expansion coefficient of the carrier substrate and that of the ceramic multilayer circuit substrate should be approximately the same in view of the reliability of the joint part. From the results of heat cycle test and stress analysis, the difference between the thermal expansion coefficient of the carrier substrate and that of the ceramic multilayer circuit substrate must be not higher than $1\times 10^{-6}/°C$. On the other hand, it has been confirmed from the heat cycle test and stress analysis that the thermal stress which results from the difference between the thermal expansion coefficient of the semiconductor device and that of the carrier substrate can be relaxed with the material comprising an organic material as the main component inserted therebetween and the reliability of the joint part can be maintained until the thermal expansion coefficient difference reaches $1\times 10^{-5}/°C$. As a result, a packaging method has been materialized in which a ceramic multilayer circuit substrate having a thermal expansion coefficient higher than that of the semiconductor device can be used. Further, the solder materials used in these joints should have melting points different from each other from the process requirement. Thus, the solder material used for joining the semiconductor device and the carrier substrate must have a higher melting point than that of the material used for joining the carrier substrate and the ceramic multilayer circuit board.

The organic resin is preferably incorporated with rubber particles and ceramic powders. The amount of the former is preferably 5 to 10 parts by weight relative to 100 parts by weight of the resin, and the amount of the latter is preferably 35 to 60% by volume relative to the whole.

The above-mentioned rubber particles preferably comprise at least one member selected from polybutadiene and silicone rubber. The above-mentioned ceramic powders preferably comprise at least one member selected from quartz, silicon carbide, silicon nitride, calcium carbonate, and silicon carbide containing beryllium.

The ceramic layer for the carrier substrate and for the multilayer circuit board preferably comprise a glass having the following composition (% being by weight):

20 to 95% of $SiO_2$ and at least one member selected from 25% or less of $Al_2O_3$, 15 to 25% of MgO, 50% or less of $B_2O_3$, 15 to 25% of ZnO, 10 to 25% of CaO, and 4 to 20% of $Li_2O$. More specifically, the following compositions are preferred.

(1) 50 to 70% of $SiO_2$, 15 to 25% of $Al_2O_3$, and 15 to 25% of MgO.

The composition may further contain 5% or less of at least one member selected from $B_2O_3$, $K_2O$, $P_2O_5$, $ZrO_2$, $CaF_2$, AlN, $Cs_2O$, and $V_2O_5$.

(2) 70 to 95% of $SiO_2$, 4 to 15% $Li_2O$, 1 to 10% of $Al_2O_3$, and 5% or less of at least one member selected from $K_2O$, MgO, and $B_2O_3$.

The composition may further contain 5% or less of at least one member selected from $P_2O_5$, $ZrO_2$, $CaF_2$, AlN, $Cs_2O$, and $V_2O_5$.

(3) 30 to 50% of $SiO_2$, 30 to 50% of $B_2O_3$, 10 to 25% of CaO, and 10 to 20% of $Li_2O$.

The composition may further contain 5% or less of at least one member selected from $K_2O$, MgO, $CaF_2$, $P_2O_5$, $ZrO_2$, AlN, $Cs_2O$ and $V_2O_5$.

(4) 55 to 82% of $SiO_2$, 15 to 25% of $B_2O_3$, 2 to 15% of $Li_2O$, and 1 to 10% of $Al_2O_3$.

The composition may further contain 5% or less of at least one member selected from $CaF_2$, $P_2O_5$, $ZrO_2$, AlN, $Cs_2O$, $V_2O_5$, MgO, and $K_2O$.

(5) 55 to 65% of $SiO_2$, 15 to 25% of ZnO, and 10% or less of at least two members selected from $Al_2O_3$, $Li_2O$, and $K_2O$.

The composition may further contain 5% or less of at least one member selected from $B_2O_3$, $CaF_2$, MgO, $K_2O$, $P_2O_5$, $ZrO_2$, AlN, $Cs_2O$, and $V_2O_5$.

(6) 20 to 30% of $SiO_2$, 10 to 15% of $Li_2O$, 40 to 50% of $B_2O_3$, and 15 to 25% of CaO.

The composition may further contain 5% or less of at least one member selected from $CaF_2$, $Al_2O_3$, $K_2O$, $P_2O_5$, $ZrO_2$, AlN, $Cs_2O$, and $V_2O_5$.

Further, this invention provides an amorphous glass powder for a ceramic multilayer circuit board which has a composition comprising 20 to 95% of $SiO_2$ and at least one member selected from 25% or less of $Al_2O_3$, 15 to 25% of MgO, 50% or less of $B_2O_3$, 15 to 25% of ZnO, 10 to 25% of CaO, and 4 to 20% of $Li_2O$, each by weight. The glass powder is preferably obtained by fusing the above-mentioned composition followed by quenching and pulverizing the resulting amorphous glass to give a particle diameter of 5 μm or less.

A ceramic multilayer circuit substrate comprising a ceramic insulating material having a specific dielectric constant of 3.0 to 4.5 and a wiring conductor material consisting mainly of gold, copper or silver, which has a low electric resistance, wired in a high density thereon has a thermal expansion coefficient considerably higher than that of a semiconductor device. Accordingly, a carrier substrate which has substantially the same thermal expansion coefficient as that of the ceramic multilayer circuit substrate is provided between the semiconductor device and the ceramic multilayer circuit substrate and is joined by means of solder, and a material comprising as the main component an organic material having substantially the same thermal expansion coefficient as that of the solder is inserted between the semiconductor device and the carrier substrate, whereby the reliability of the solder joint part is improved. Thus, even for a ceramic multilayer circuit substrate having a relatively high thermal expansion coefficient, a packaging method has been obtained by which semiconductor devides can be packed in a high density and yet a high reliability of the joint part can be obtained. Moreover, detachment is possible at the solder part joining the carrier substrate mounted with the semiconductor device and the ceramic multilayer circuit substrate, whereby the surface of the semiconductor device can be protected.

EXAMPLE

This invention will be described below with reference to Examples. In the following description, "part" means part by weight and "%" means % by weight, unless specified otherwise.

EXAMPLE 1

Glass powders were prepared by fusing the compositions shown in Table 1 followed by quenching, and then pulverizing the resulting amorphous glass to a particle diameter of 5 μm or less.

To a mixture of 40 parts of hollow silica microspheres having an average diameter of 28 μm and 60 parts of glass powders (average particle diameter: 1 μm) having the composition shown in Table 1, were added 12.5 parts of polyvinyl butyral resin having an average degree of polymerization of 1,000 as a binder, 4.0 parts of butylphthalyl butylglycolate as a plasticizer, and 62.0 parts of trichloroethylene, 16.0 parts of tetrachloroethylene, and 22.0 parts of n-butyl alcohol respectivley as a solvent. The whole was mixed in a wet ball mill to obtain a slurry. The slurry was then freed from air bubbles entrained therein during the ball milling by means of an agitated vacuum deaerator and adjusted to a desired viscosity. It was then coated in 0.2 mm thickness on a silicone-treated polyester film support by use of the doctor blade method and then stripped of the solvent in a drying oven to obtain a green sheet.

TABLE 1

| No. | SiO$_2$ | Al$_2$O$_3$ | Li$_2$O | K$_2$O | MgO | B$_2$O$_3$ | CaO | Others | |
|---|---|---|---|---|---|---|---|---|---|
| 1 | 50–60 | 18–25 | | | 15–25 | 0–2 | | AlPO$_4$ | 50–60 |
| 2 | 75–85 | 2–6 | 10–15 | 2–3 | | | | P$_2$O$_5$ | 1–3 |
| 3 | 75–85 | 2–6 | 10–15 | 2–3 | | | | ZrO$_2$ | 1–3 |
| 4 | 75–85 | 2–6 | 10–15 | 2–3 | | | | CaF$_2$ | 1–3 |
| 5 | 85–95 | 1–3 | 4–8 | 1–2 | | | | P$_2$O$_5$ | 0–2 |
| 6 | 85–95 | 1–3 | 4–8 | 1–2 | | | | ZrO$_2$ | 0–2 |
| 7 | 75–85 | 2–6 | 10–15 | 2–3 | 2–4 | | | ZrO$_2$ | 1–3 |
| 8 | 75–85 | 2–6 | 10–15 | 2–3 | 1–3 | | | CaF$_2$ | 1–3 |
| 9 | 75–85 | 2–6 | 10–15 | 1–9 | | | | | |
| 10 | 35–45 | 4–6 | | | | 30–40 | 10–15 | CaF$_2$ | 1–3 |
| 11 | 55–65 | | 7–13 | | | 7–13 | | Y$_2$O$_3$ | 25–35 |
| 12 | 65–75 | 1–3 | 2–5 | 0–1 | 3–5 | 15–25 | | CaF$_2$ | 0–2 |
| 13 | 60–70 | 2–5 | 7–11 | 0–1 | 1–3 | 15–22 | | CaF$_2$ | 1–3 |
| 14 | 20–30 | | 10–15 | | | 40–50 | 15–25 | | |
| 15 | 55–65 | 2–6 | 5–9 | 5–9 | | 15–25 | | CaF$_2$ | 1–3 |
| 16 | 55–65 | 3–7 | 4–8 | 2–6 | | 1–5 | | CaF$_2$ | 1–3, ZnO 15–25 |
| 17 | 70–80 | 4–8 | 10–15 | 1–3 | 1–3 | 1–5 | | CaF$_2$ | 1–3 |
| 18 | 70–85 | 3–7 | 6–12 | 2–4 | | | | CaF$_2$ | 1–3, AlN 4–6 |
| 19 | 75–85 | 3–7 | 10–15 | | | | | Cs$_2$O 2–4, V$_2$O$_5$ | 1–3 |

The green sheet was cut into 210 mm squares and pressed at a pressure of 5 kgf/cm$^2$ at 100° C. to level the surface. Then, by use of a punching machine, the sheet was cut to 200 mm square and a guide hole was provided thereto. Then the green sheet was fixed by utilizing the guide hole, and a via-hole 0.1 mm in diameter was bored therethrough at a predetermined position by electron beam machining. A conductor paste comprising gold powder, nitrocellulose, ethylcellulose, polyvinyl butyral and trichloroethylene in a ratio of 100:3:1:2:23 (by weight) was filled into the via-hole bored in the green sheet. Then, the conductor paste was printed according to a predetermined circuit pattern by means of screen printing. Fifty green sheets thus obtained were piled up in alignment at the guide hole position and laminated at 120° C. at a pressure of 25 kgf/cm$^2$. Then, it was subjected to blanking to obtain a 150 mm square green sheet laminate. The laminate was placed in an oven in air atmosphere and maintained at a maximum temperature of 850° C. to 960° C. for 1 hour to effect firing. Thus, a ceramic multilayer circuit substrate 120 mm square and 7 mm thick was prepared.

A carrier substrate was prepared in the same manner as that for the ceramic multilayer circuit substrate except that the via-hole position and the wiring pattern were changed, the number of sheets laminated was 7, and the dimension of the carrier substrate after firing was 11 mm square and 1 mm thick.

A 10 mm square semiconductor device (silicon) was joined to the carrier substrate with a 95% lead–5% tin solder. Then, between the carrier substrate and the semiconductor device, was inserted a material having substantially the same thermal expansion coefficient as that of the soldering material which comprises an organic mixture consisting of 100 parts of an epoxy resin (EP-828, a trade name) and 5 to 10 parts of a polybutadiene (CTBN 1300×9, a trade name) and 35 to 60% by volume of quartz powder having an average particle diameter of 1 μm incorporated thereinto. Then, 9×9=81 pieces of the carrier substrates (to which the semiconductor had been joined and the material mainly comprising the organic material had been inserted) were joined onto the ceramic multilayer circuit substrate (to which a kovar pin had been joined with a gold-germanium solder) with a 60% lead–40% tin solder to prepare a semiconductor module.

The characteristic properties of the ceramic multilayer circuit substrate, thus prepared and the reliability of the solder joint part in the module substrate are shown in Table 2. The ceramic insulating material used in the ceramic multilayer circuit substrate showed a specific dielectric constant (at 1 MHz) of 3.0 to 4.5 and a delay time of electric signal of 5.7 to 7.0 ns. Thus, a speed-up of 31 to 44% has been attained as compared with a ceramic multilayer circuit substrate comprising alumina as the main component, which showed a high specific dielectric constant of 9.5 and a delay time of electric signal of 10.2 ns. Since the ceramic multilayer circuit substrate No. 20 had a thermal expansion coefficient of 7.0 to 9.0×10$^{-6}$/°C., some of the material systems developed cracks inside owing to the difference in thermal expansion coefficient between gold, the internal wiring conductor material, and the ceramic insulating material. However, since the ceramic multilayer circuit substrates Nos. 21 to 38 had a thermal expansion coefficient of 8.0 to 13.0×10$^{-6}$/°C., they matched well with gold, the internal wiring conductor material, and caused no crack within the substrate. In the semiconductor module, on the other hand, no breaking of wire occurred at all at the solder joint part even after repetition of 3000 heat cycles of −55° C. to 150° C. This is fully satisfactory for the life required for a large electronic computer.

TABLE 2

| | | Properties of ceramic multilayer circuit substrate | | | | |
|---|---|---|---|---|---|---|
| No. | Glass No. | Specific dielectric constant (1 MHz) | Signal delay time (ns) | Thermal expansion coefficient (10$^{-6}$/°C.) | Crack in substrate | Reliability of solder joint (o: good) |
| 20 | 1 | 3.8–4.5 | 6.4–7.0 | 7.0–9.0 | Slightly present | o |
| 21 | 2 | 3.2–4.0 | 5.9–6.6 | 7.0–11.0 | None | o |
| 22 | 3 | 3.3–4.0 | 6.0–6.6 | 10.0–12.0 | " | o |
| 23 | 4 | 3.2–4.0 | 5.9–6.6 | 9.5–11.5 | " | o |
| 24 | 5 | 3.0–3.7 | 5.7–6.4 | 10.0–12.0 | " | o |
| 25 | 6 | 3.0–3.7 | 5.7–6.4 | 10.5–13.0 | " | o |

TABLE 2-continued

| No. | Glass No. | Specific dielectric constant (1 MHz) | Signal delay time (ns) | Thermal expansion coefficient ($10^{-6}/°C$) | Crack in substrate | Reliability of solder joint (o: good) |
|---|---|---|---|---|---|---|
| 26 | 7 | 3.4–4.2 | 6.1–5.8 | 9.5–11.5 | " | o |
| 27 | 8 | 3.3–4.1 | 6.0–6.7 | 9.5–11.5 | " | o |
| 28 | 9 | 3.2–4.0 | 5.9–6.6 | 9.0–11.0 | " | o |
| 29 | 10 | 3.8–4.5 | 6.4–6.9 | 8.0–10.0 | " | o |
| 30 | 11 | 3.8–4.4 | 6.4–6.9 | 10.5–13.0 | " | o |
| 31 | 12 | 3.6–4.3 | 6.3–6.9 | 10.0–12.0 | " | o |
| 32 | 13 | 3.7–4.3 | 6.4–6.9 | 9.5–11.5 | " | o |
| 33 | 14 | 3.7–4.3 | 6.4–6.9 | 10.0–13.0 | " | o |
| 34 | 15 | 3.6–4.3 | 6.3–6.9 | 9.0–11.0 | " | o |
| 35 | 16 | 3.6–4.4 | 6.3–6.9 | 8.0–10.0 | " | o |
| 36 | 17 | 3.6–4.4 | 6.3–6.9 | 7.5–9.5 | " | o |
| 37 | 18 | 3.5–4.2 | 6.2–6.8 | 8.5–10.5 | " | o |
| 38 | 19 | 3.5–4.3 | 6.2–6.9 | 8.5–10.5 | " | o |

EXAMPLE 2

Semiconductor devices were prepared in the same manner as in Example 1 described above except for the following modification:

Polymethacrylate resin was used in place of the polyvinyl butyral resin of an average degree of polymerization of 1,000.

Diethyl phthalate was used in place of butylphthalyl butylglycollate.

Copper powder was used in place of gold powder.

Polymethacrylate was used in place of polyvinyl butyral.

A nitrogen atmosphere oven was used in place of an air atmosphere oven.

The characteristic properties of the ceramic multilayer circuit substrate thus prepared and the reliability of the solder joint part in the module substrate are shown in Table 3. The ceramic insulating material used in the ceramic multilayer circuit substrate had a specific dielectric constant at 1 MHz of 3.0 to 4.5 and showed an electric signal delay time of 5.7 to 7.0 ns. Thus, a speed-up of 31 to 44% has been attained as compared with an alumina-type ceramic multilayer circuit substrate. In the ceramic multilayer circuit substrate Nos. 39, 48, 54 and 55, some of the material systems had a thermal expansion coefficient of less than one half of that of copper used as the internal wiring conductor material, and resultantly the ceramic insulating materials did not match well with copper, leading to development of cracks.

TABLE 3

| No. | Glass No. | Specific dielectric constant (1 MHz) | Signal delay time (ns) | Thermal expansion coefficient ($10^{-6}/°C$) | Crack in substrate | Reliability of solver joint[1] |
|---|---|---|---|---|---|---|
| 39 | 1 | 3.8–4.5 | 6.4–7.0 | 7.1–9.2 | Slightly present | o |
| 40 | 2 | 3.2–4.0 | 5.9–6.6 | 9.2–11.2 | None | o |
| 41 | 3 | 3.3–4.0 | 6.0–6.6 | 10.2–12.2 | " | o |
| 42 | 4 | 3.2–4.0 | 5.9–6.6 | 9.7–11.7 | " | o |
| 43 | 5 | 3.0–3.7 | 5.7–6.4 | 10.2–12.2 | " | o |
| 44 | 6 | 3.0–3.7 | 5.7–6.4 | 10.7–13.2 | " | Δ |
| 45 | 7 | 3.4–4.2 | 6.1–6.8 | 9.7–11.7 | " | o |
| 46 | 8 | 3.3–4.1 | 6.0–6.7 | 9.7–11.7 | " | o |
| 47 | 9 | 3.2–4.0 | 5.9–6.6 | 9.2–11.2 | " | o |
| 48 | 10 | 3.8–4.5 | 6.4–7.0 | 8.1–10.2 | Slightly present | o |
| 49 | 11 | 3.8–4.4 | 6.4–6.9 | 10.7–13.2 | None | Δ |
| 50 | 12 | 3.6–4.3 | 6.3–6.9 | 10.2–12.2 | " | o |
| 51 | 13 | 3.7–4.3 | 6.4–6.9 | 9.7–11.7 | " | o |
| 52 | 14 | 3.7–4.3 | 6.4–6.9 | 10.2–13.2 | " | Δ |
| 53 | 15 | 3.6–4.3 | 6.3–6.9 | 9.2–11.2 | " | o |
| 54 | 16 | 3.6–4.4 | 6.3–6.9 | 8.1–10.2 | Slightly present | o |
| 55 | 17 | 3.6–4.4 | 6.3–6.9 | 7.6–9.7 | Slightly present | o |
| 56 | 18 | 3.5–4.2 | 6.2–6.8 | 8.6–10.7 | None | o |
| 57 | 19 | 3.5–4.3 | 6.2–6.9 | 8.6–10.7 | " | o |

Note
[1] o: Good, Δ: Fairly good

In other ceramic multilayer circuit substrate than those mentioned above, however, no development of cracks was observed and the ceramic insulating materials matched well with copper. On the other hand, in the heat cycle test of −55° to 150° C. repeated 3000 times for the semiconductor modules, some cracks developed in the solder joint parts of modules Nos. 44, 49 and 52, showing the possibility of breaking of wire occurring on repetition of the heat cycle. Other modules than those mentioned above showed no change in the solder joint part, and thus demonstrated that they can be used satisfactorily in practice.

EXAMPLE 3

Modules were prepared in the same manner as in Examples 1 and 2 except for the following modifications:

To prepare a carrier substrate, a white substrate (having no via-hole nor wiring pattern) obtained by laminating seven green sheets followed by firing was cut to 11 mm square. A carrier substrate was then prepared by making a hole of 0.1 mm diameter in the white substrate by means of laser and then filling copper into the hole by means of plating.

The modulus thus prepared gave similar results to those obtained in Examples 1 and 2.

EXAMPLE 4

Multilayer wiring circuits using copper and polyimide were formed on the ceramic multilayer circuit substrates prepared in Examples 1 and 2. The ceramic multilayer circuit substrates comprised 26 layers.

On the ceramic multilayer circuit substrate, were formed chromium film of 0.03 μm thickness and copper film of 0.1 μm thickness by means of vacuum deposition. Then, positive-type photoresist was coated thereon to a thickness of 22 μm, a wiring pattern was formed, and a copper wiring layer of 20 μm thickness was formed by electrolytic plating. Subsequently, positive-type photoresist was coated to a thickness of 22 μm, an interlayer connection pattern was formed, and a projection for interlayer connection of copper 20 μm in thickness was formed by electrolytic plating. After removal of the positive-type photoresist, the unnecessary part of the copper film and of the chromium film were removed by ion milling using argon. Subsequently, a low thermal expansion polyimide-type resin was coated to a thickness of 50 μm and cured to form an insulating layer. Then, the surface of the low thermal expansion polyimide-type resin layer was smoothed by surface polishing. Further, the projection for interlayer connection was exposed by means of wet etching using a hydrazine hydrate-ethylenediamine liquid mixture. Subsequently, a copper wiring layer of 20 μm thickness was formed in the same manner as that for the first layer wiring. In such a manner, 3 layers of copper wiring were formed on the ceramic multilayer circuit substrate.

A semiconductor device and a carrier substrate were mounted in the same manner as in Examples 1 to 3. Thus, a module substrate was prepared.

The module substrate prepared according to this Example showed a decrease of about 5% in signal propagation delay time as compared with the module substrates prepared according to Examples 1 to 3. This comes from the fact that the low thermal expansion polyimide insulating material has a specific dielectric constant of 3.5. The reliability of the solder joint part was substantially the same as that in Examples 1 to 3. This is because, since the thickness of the multilayer wiring circuit of polyimide and copper formed on the ceramic multilayer circuit substrate is small, the change in the thermal expansion coefficient is small.

According to this invention, since the ceramic insulating material used has a relatively high thermal expansion coefficient, it makes possible a high density wiring of a wiring conductor material comprising, as the main component, gold, copper or silver, which have a low electric resistance. Further, a packaging method has been obtained by which semiconductor devices can be packed in a high density and yet a high reliability of the joint part can be obtained, even for a ceramics multilayer circuit substrate having a relatively high thermal expansion coefficient, by providing a carrier substrate between the semiconductor device and the ceramic multilayer circuit substrate, joining them with solder, and insulating a material comprising as the main component an organic material having substantially the same thermal expansion coefficient as that of the solder between the semiconductor device and the carrier substrate.

We claim:

1. A ceramic multilayer circuit board comprising ceramic layers and wiring conductor layers laminated alternately, in which the ceramic layers are formed from a glass which consists essentially of 20 to 85% of $SiO_2$ and at least one member selected from 25% or less of $Al_2O_3$, 1 to 25% of MgO, 50% or less of $B_2O_3$, 15 to 25% of ZnO, 10 to 25% of CaO, 2 to 20% of $Li_2O$, 10% or less of $K_2O$, 50 to 60% $AlPO_4$, 25 to 35% $Y_2O_3$, 5% or less of $P_2O_5$, 5% or less of $ZrO_2$, 5% or less of $CaF_2$, 6% or less of AlN, 5% or less of $Cs_2O$, and 5% or less of $V_2O_5$, each by weight, and which softens at a temperature not higher than the melting point of the wiring conductor layer and wherein the ceramic layer has a thermal expansion coefficient lower than that of the wiring layer but not lower than one half that of the wiring layer.

2. A ceramic multilayer circuit board according to claim 1, wherein said ceramic layers are formed from a glass consisting essentially of 75 to 85% $SiO_2$, 2 to 6% $Al_2O_3$, 10 to 15% $Li_2O$, 2 to 3% $K_2O$, and 1 to 3% $CaF_2$.

3. A ceramic multilayer circuit board according to claim 1, wherein the ceramic layer has a thermal expansion coefficient not lower than $7.2 \times 10^{-6}/°C$. and a specific dielectric constant at 1 MHz not higher than 4.5, and the wiring conductor layer is formed from either gold, or silver, or copper.

4. A ceramic multilayer circuit board comprising ceramic layers and wiring conductor layers laminated alternately, in which the ceramic layer has a thermal expansion coefficient lower than, and not lower than one half of, that of the wiring conductor layer, and further comprises hollow silica having a particle diameter of not more than 100 μm dispersed in a glass which softens at a temperature not higher than the melting point of the wiring conductor layer.

5. A ceramic multilayer circuit board according to claim 4, wherein the content of said hollow silica microsphered is 35 to 60% by volume relative to the ceramic layer.

6. A semiconductor module comprising a ceramic multilayer circuit board mounted with a ceramic carrier substrate, said carrier substrate being mounted with a semiconductor device, in which the carrier substrate and the multilayer circuit board each comprise ceramic layers and wiring conductor layers laminated alternately, and the ceramic layer has a thermal expansion coefficient lower than, and not lower than one half of, that of the wiring conductor layer and further the ceramic layer comprises a glass which softens at a temperature not higher than the melting point of the wiring conductor layer.

7. A semiconductor module according to claim 6, wherein the ceramic carrier substrate and the semiconductor device are joined by means of solder bump, said solder bump being covered with an organic resin.

8. A semiconductor module according to claim 7, wherein the organic resin comprises 100 parts by weight of said resin, 5 to 10 parts by weight of rubber particles, and 35 to 60% by volume of ceramic powders.

9. A semiconductor module according to claim 8, wheren the rubber particle comprises at least one member selected from polybutadiene and silicone rubber, and the ceramic powder comprises at least one member selected from quartz, silicon carbide, silicon nitride, calcium carbonate, and silicon carbide containing beryllium.

* * * * *